United States Patent

Fiegl et al.

[11] Patent Number: 5,804,490
[45] Date of Patent: Sep. 8, 1998

[54] METHOD OF FILLING SHALLOW TRENCHES

[75] Inventors: Bernhard Fiegl, Wappingers Falls, N.Y.; Walter Glashauser, Deisenhofen, Germany; Max G. Levy, Wappingers Falls; Victor R. Nastasi, Hopewell Junction, both of N.Y.

[73] Assignees: International Business Machines Corporation, Armonk, N.Y.; Siemens Aktiengesellschaft, Munich, Germany

[21] Appl. No.: 824,703

[22] Filed: Apr. 14, 1997

[51] Int. Cl.[6] .................................................. H01L 21/76
[52] U.S. Cl. ............................ 438/424; 438/430; 438/435
[58] Field of Search ..................................... 438/424, 430, 438/435, 691, 692, 693

[56] References Cited

U.S. PATENT DOCUMENTS 4,389,294  6/1983  Anantha et al. ........................ 438/424
4,791,073  12/1988  Nagy et al. ............................. 438/435
5,015,602  5/1991  Van Der Plas et al. ................ 438/424

Primary Examiner—Joni Chang

[57] ABSTRACT

A method of isolation in silicon integrated circuit processing overfills the trench by a fill margin, deposits a temporary layer of poly having a thickness less than the trench depth by the thickness of an oxide polish stop, so that the top of the polish stop is coplanar with the top of the fill layer outside the trench; the temporary layer is polished outside the trench, using the fill layer and the polish stop layer as polish stops; the polish stop layer is removed together with the same thickness of the fill layer and temporary layer, preserving planarity that is destroyed by selectively etching the fill layer; the remaining temporary layer is stripped and a final touch up polish of the fill layer stops on the pad nitride.

6 Claims, 1 Drawing Sheet

METHOD OF FILLING SHALLOW TRENCHES

TECHNICAL FIELD

The field of the invention is that of silicon integrated circuit processing using shallow trenches filled with oxide for isolation.

BACKGROUND OF THE INVENTION

The geometrical advantage of shallow trenches with vertical walls for device isolation in submicron integrated circuit processing, as compared with LOCOS (local oxidation of silicon) isolation with its thickness limitations and the lateral spread caused by diffusion during oxidation, is well known in the art.

Once the trenches have been filled, it is necessary to remove the filling material over the non-trench area without removing the material that was just put in the trench—a process that is referred to as planarization, since it results in a surface for the filled trench that is coplanar with the remainder of the circuit.

One of many methods is illustrated in IBM Technical Disclosure Bulletin, Vol. 32, No. 9A (February, 1990), page 439. In that method, a thin layer of poly and a thick layer of oxide are deposited over the oxide filling layer. The thick layer of oxide is etched away from active areas and narrow trenches and a planar surface is formed by depositing another layer of poly and polishing it, using the thick oxide over the wide trenches as a polish stop. Having created a planar surface, the remaining oxide and poly layers are etched in an etchant that attacks poly and oxide at the same rate. This method is relatively fast, but suffers from the drawback that it has a small process window due to the thickness of oxide that must be polished. This method also suffers from scratches formed during the polishing process, which detract from the yield.

SUMMARY OF THE INVENTION

The invention relates to a method for filling shallow isolation trenches that improves the manufacturability and yield of the process.

A feature of the invention is the formation of an intermediate upper planar layer and then destroying the planarity by selectively etching a lower layer of thick oxide.

DESCRIPTION OF THE PREFERRED EMBODIMENTS

Figure 1A:
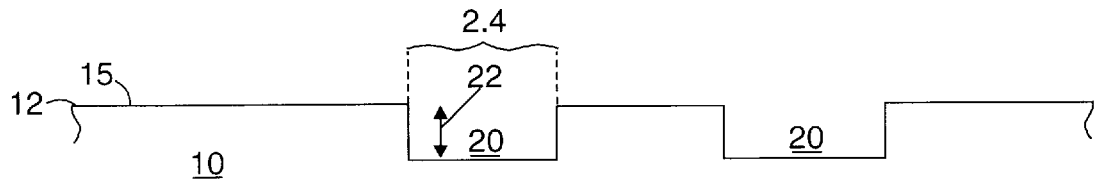
FIGS. 1A–1D illustrate a portion of an integrated circuit at various stages of the invention.

Referring now to FIG. 1A, there is shown a silicon substrate 10 into which is cut two isolation trenches 20 by a conventional dry etch (or reactive ion etch, RIE) process that produces straight sides. These trenches will be filled with oxide ($SiO_2$) as an isolation material. The trenches are made as small as the groundrules for a particular process will allow, illustratively about 1.5 $\mu$m for a process with a minimum linewidth of 0.35 $\mu$m. The depth of the trench is denoted with arrow 22 and is illustratively 0.48 $\mu$m. The figure is not to scale, with the various dimensions being drawn for clarity of explanation. Illustratively, the area between trenches 20 is an active area that will hold a transistor and the larger area to the left is reserved for connecting wires. The area outside the trenches is covered with a conventional pad nitride ($Si_3N_4$) 12, having an illustrative initial thickness of 110 nm and having a top surface 15 (referred to as the reference surface, since the top of the trench oxide will be referenced to it).

Those skilled in the art are well aware that yield is improved by keeping the magnitude of vertical steps small, so it is desirable to have the top of the isolation material that will be put in the trench coplanar with the surface of the contacts in the transistor (since connections to some transistors will have to pass over the trench material). This requires that the top of the isolation material be close in height to the top of the active area. A simple method is to use conventional chemical mechanical polishing (CMP) to polish away the oxide, using the pad nitride as a polish stop. Since nitride is much harder than oxide and the trenches cover much less area than the remainder of the circuit, the pad nitride makes a good polish stop. Such a simple process has the drawback of small process window and CMP scratches, and the art uses considerably more complex processes. The method disclosed in the IBM Technical Disclosure Bulletin, for example, uses three additional layers and a sequence of etching and polishing steps to produce an upper planar surface that is then preserved while the remainder of the material is removed.

Figure 1B:
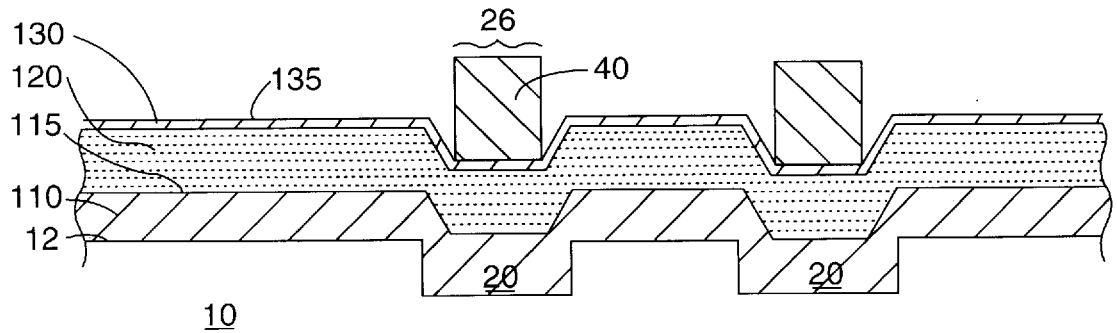

Referring to FIG. 1B, there is shown the same area after some intermediate steps that include depositing an oxide fill layer 110 having a thickness of trench depth 22 plus a fill margin, about 15% of the trench depth (illustratively 80 nm for a total nominal thickness of 560 nm) over trench 20 and nitride 12. The result is that fill layer 110 has a top surface 115 above trench 20 that is higher than the reference surface 15 by the fill margin in the lowest portion of fill layer 110. The lowest portion of the fill layer is separated from the reference surface by a step in layer 110 that is referred to as a shoulder portion of the fill layer.

Above fill layer 110, there is a temporary polysilicon (poly) fill layer 120, having a thickness that is the trench depth 22 minus a polish margin, deposited above trench 20 and reference surface 15 and an oxide polish stop layer 130 having a thickness that is equal to the polish margin. Illustratively, layer 110 has a thickness of 560 nm and polish stop layer 130 has a thickness of 100 nm. The result of this dimensional choice is that top surface 135 of polish stop layer 130 above trench 20 is substantially coplanar with top surface 115 of fill layer 110 above reference surface 15.

Once the layers are formed, photoresist polish mask 40 is deposited and patterned on polish stop layer 130 directly above the lowest portion of fill layer 110, i.e. above trench 20. Polish stop layer 130 is then etched outside polish mask 40, illustratively with a conventional reactive ion etch or wet etch to expose the temporary layer for removal.

Figure 1C:
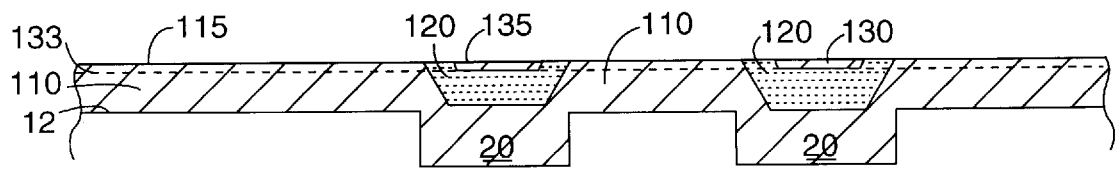

FIG. 1C shows the results of stripping layer 130 and polishing temporary layer 120 in a conventional CMP, stopping on top surface 135 of polish layer 130 and top surface 115 of fill layer 110, thereby creating an upper planar surface across the wafer coplanar with top surface 115 of fill layer 110. The structure is now generally similar to that of the IBM Technical Disclosure Bulletin reference, in that there is an upper planar surface, though the composition and structure of the lower layers is different. If the method of the IBM Technical Disclosure Bulletin reference were followed, the structure would be etched or polished down to surface 15.

Instead, polish stop layer 130, a thin portion of fill layer 110 and small segments of temporary layer 120 between polish stop layer 130 and fill layer 110 are removed to a depth indicated in FIG. 1C by line 133, illustratively by a conventional nonselective RIE process in an AME 5000 etching tool employing $CF_4$ and $CHF_3$ in a ratio of about 4:1., thereby leaving a cover portion of temporary layer 120 above trench 20 and preserving a planar surface 133. Since the process etches oxide, poly and nitride at the same rate, the planarity is preserved.

Next, the upper planar surface 133 is destroyed by etching that portion of fill layer 110 outside the cover portion of temporary layer 120, i.e. outside the trench, to a removal depth less than the depth of trench 20, in an AME 5000 etch tool using substantially equal amounts of $CF_4$ and $CHF_3$ in a selective process that preferentially etches fill layer 110 without affecting temporary layer 120, the removal depth being less than the thickness of layer 110, leaving a thin remaining oxide layer so that a top surface 117 of fill layer 110 above reference surface 15 is substantially coplanar to the corresponding original top surface 115 of fill layer 110 above the trench.

Figure 1D:
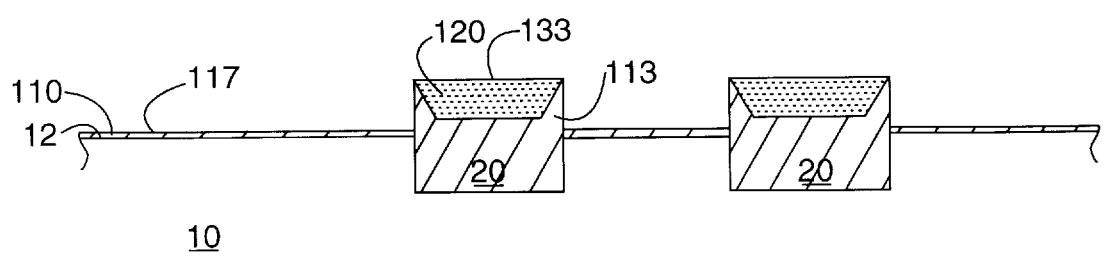
Figure 2:
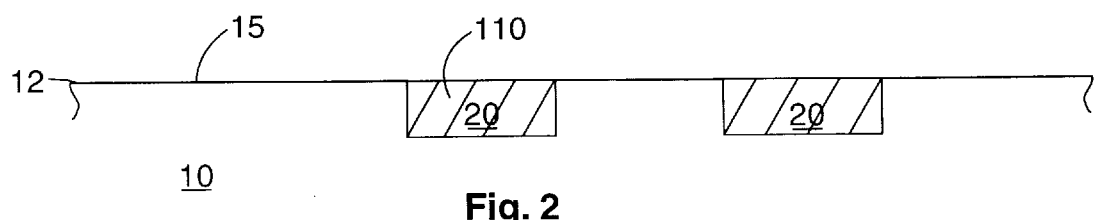
FIG. 2 illustrates the result of the invention.

The result is shown in FIG. 1D. It can be seen there that the step of etching outside cover portion 120 leaves stubs 113 of layer 110. One skilled in the art would avoid a process that leaves such stubs because they can break off in relatively large pieces during the next polishing operation and scratch the surface of the trench fill. A subsequent oxide strip of the pad oxide will enlarge such cracks and can detract from the yield.

Then, the remaining portion of temporary layer 120 over the trench is removed in a timed etch with an etching chemistry ($SF_6$ and $NF_3$ in a ratio of about 6:1) that etches the temporary layer, but not the fill layer 110, with a conventional selective RIE. Last, a "touch up" polish (meaning a polish that removes a layer of less than 100 nm) removes the last thin portion of fill layer 110, stopping on reference surface 15 of pad nitride 12.

One skilled in the art would not think to perform these extra steps of etching the fill layer above the pad nitride and then stripping the remainder of poly 120 instead of the simpler process of the prior art because, once the poly is planarized down to fill layer 110, a conventional next step would be to continue to polish down to the pad nitride. Instead, a timed etch is used to etch fill layer 110 down to a level that is calculated to be the same as the top surface of layer 110 underneath poly 120. Though the poly CMP process planarizes well down to the fill layer, due to the high selectivity between poly and oxide (~200:1), the oxide CMP process does not planarize as well when removing thick oxide layers because of a low oxide selectivity to nitride (~1.5:1). These extra steps of etching the fill layer above the nitride and stripping the remaining poly essentially "pre-planarizes" the oxide CMP, with the result that only an oxide "touch-up" CMP polish is needed, which greatly improves the process window and manufacturability.

The process window is robust. Extensive experimentation has shown that less than 0.1% of wafers satisfying the criteria for initial thickness of nitride 12 and oxide 110 are rejected at the end of this process; with no adjustment of the process by the operator. In addition, the uniformity of layers 12 and 110 after the process is greater than the uniformity before the process.

While the invention has been described in terms of a single preferred embodiment, those skilled in the art will recognize that the invention can be practiced in various versions within the spirit and scope of the following claims.

We claim:

1. A method of filling and planarizing a trench in a substrate to a reference surface, said trench having a trench depth and a trench width, comprising the steps of:

depositing a first fill layer having a thickness of said trench depth plus a fill margin over said trench and said reference surface, whereby a portion of said first fill layer in said trench has a fill top surface higher than said reference surface by said fill margin in a lowest portion of said first fill layer above said trench, said lowest portion being separated from said reference surface by a shoulder portion of said first fill layer;

depositing a temporary fill layer having a thickness of said trench depth minus a polish margin above said trench and said reference surface;

depositing a polish stop layer having a thickness of said polish margin above said trench and said reference surface, whereby a polish top surface of said polish stop layer above said trench and said fill top surface of said first fill layer above said reference surface are substantially coplanar;

forming a polish mask on said polish stop layer directly above said lowest portion;

removing said polish stop layer outside said polish mask;

polishing said temporary fill layer, stopping on said polish top surface of said polish stop layer and said fill top surface of said first fill layer, thereby creating an upper planar surface coplanar with said fill top surface of said first fill layer;

removing said polish stop layer with an etching chemistry that etches both said polish stop layer and said temporary fill layer, thereby leaving a cover portion of said temporary fill layer above said trench and preserving an intermediate planar surface;

destroying said intermediate planar surface by etching a portion of said first fill layer outside said cover portion of said temporary fill layer to a removal depth less than said trench depth, using a chemistry that preferentially etches said first fill layer, said removal depth being such that a second fill top surface of said first fill layer above said reference surface is substantially coplanar with said fill top surface of said first fill layer in said trench;

removing said temporary fill layer with an etching chemistry that etches said temporary fill layer but not said first fill layer; and polishing said first fill layer, stopping on said reference surface.

2. A method according to claim 1, in which said first fill layer is formed from oxide, said temporary fill layer is formed from polysilicon, and said polish stop layer is formed from oxide.

3. A method according to claim 2, in which said fill margin is about fifteen per cent of said trench depth and said polish margin is about 100 nm.

4. A method according to claim 1, in which said step of destroying said intermediate planar surface by etching leaves a structure above said trench comprising a layer of said temporary fill layer above at least one stub portion of said first fill layer projecting above said intermediate planar surface, whereby said intermediate planar surface is broken by said stub portion.

5. A method according to claim 4, in which said first fill layer is formed from oxide, said temporary fill layer is formed from polysilicon, and said polish stop layer is formed from oxide.

* * * * *